(12) United States Patent
Pichl et al.

(10) Patent No.: US 9,035,669 B2
(45) Date of Patent: May 19, 2015

(54) APPARATUS AND METHOD FOR TESTING ELECTRONIC DEVICES

(71) Applicant: Multitest Elektronische Systeme GmbH, Rosenheim (DE)

(72) Inventors: Franz Pichl, Uebersee (DE); Michael Hertkorn, Frasdorf (DE); Guenther Jeserer, Tuntenhausen (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 100 days.

(21) Appl. No.: 13/772,178

(22) Filed: Feb. 20, 2013

(65) Prior Publication Data
US 2014/0232423 A1 Aug. 21, 2014

(30) Foreign Application Priority Data
Feb. 20, 2013 (DE) .................... 13 155 976

(51) Int. Cl.
G01R 31/10 (2006.01)
G01R 31/28 (2006.01)
(52) U.S. Cl.
CPC ........ G01R 31/2891 (2013.01); G01R 31/2874 (2013.01)
(58) Field of Classification Search
USPC ............... 324/750.01–750.08, 500, 425, 431, 324/670, 685, 721
See application file for complete search history.

(56) References Cited

U.S. PATENT DOCUMENTS

| | | | |
|---|---|---|---|
| 5,977,785 A | 11/1999 | Burward-Hoy | |
| 6,861,861 B2 * | 3/2005 | Song et al. | 324/750.09 |
| 7,043,338 B2 * | 5/2006 | Jinno | 700/245 |
| 7,043,388 B2 | 5/2006 | Cram | |
| 7,558,064 B2 * | 7/2009 | Nakamura et al. | 361/698 |
| 8,303,008 B2 * | 11/2012 | Jeserer et al. | 294/185 |
| 2002/0088113 A1 | 7/2002 | Hwang | |

(Continued)

FOREIGN PATENT DOCUMENTS

| | | |
|---|---|---|
| JP | 2000-180502 | 6/2000 |
| JP | 2001-116800 | 4/2001 |

(Continued)

OTHER PUBLICATIONS

Communication with Extended European Search Report for Application No. 13155976.7; date of mailing Jul. 12, 2013; 6 pages.

(Continued)

*Primary Examiner* — Melissa Koval
*Assistant Examiner* — Trung Nguyen
(74) *Attorney, Agent, or Firm* — Christie, Parker & Hale, LLP

(57) ABSTRACT

An apparatus for testing electronic devices, having a test head coupled to at least one immovably mounted test socket, a positioning device for positioning the electronic device in testing position and a lead-backer attached to the positioning device for supporting the electronic device and pressing it against the test socket. A supply port for supplying a temperature control medium to a temperature control system of the said lead-backer is immovably mounted beside the said test socket, the said temperature control system of the said lead-backer and the said supply port communicate with each other when the electronic device is in testing position, whereby the said temperature control medium flows from the said supply port to the said temperature control system of the said lead-backer.

9 Claims, 2 Drawing Sheets

(56) References Cited

U.S. PATENT DOCUMENTS

Figure 1:
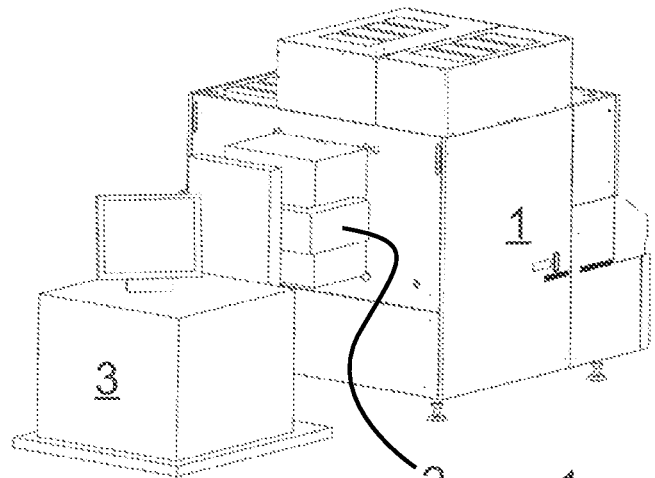

| | | |
|---|---|---|
| 2002/0109518 A1 | 8/2002 | Saito et al. |
| 2004/0070416 A1 | 4/2004 | Saito et al. |
| 2006/0255822 A1* | 11/2006 | Saito et al. .................. 324/760 |
| 2007/0058350 A1 | 3/2007 | Nakamura |
| 2007/0200555 A1 | 8/2007 | Mizushima et al. |

FOREIGN PATENT DOCUMENTS

| | | |
|---|---|---|
| KR | 10-0427094 | 4/2004 |
| WO | WO 2006/123404 | 11/2006 |

OTHER PUBLICATIONS

Japanese Office action issued in parallel Japanese Application No. 2014-024963 with English translation; date of mailing Dec. 16, 2014; 8 pages.

Korean Office action issued in parallel Korean Application No. 10-2014-0017969 with English translation; date of mailing Nov. 28, 2014; 11 pages.

English translation of Korean Patent Publication No. 10-0427094; date of publication Apr. 17, 2004; 48 pages.

* cited by examiner

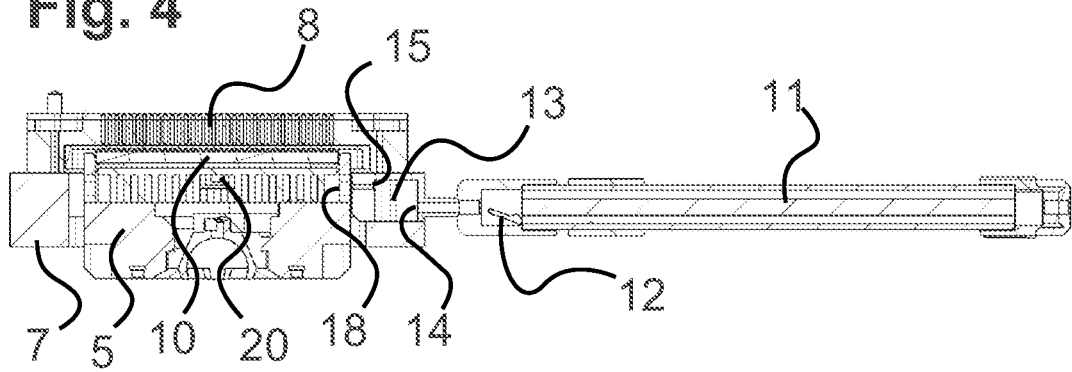
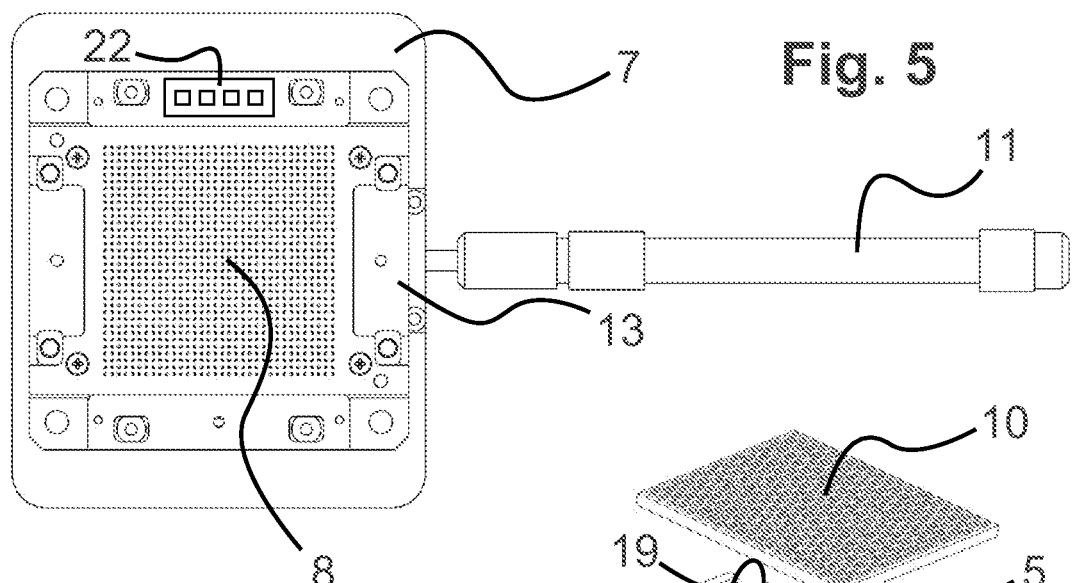
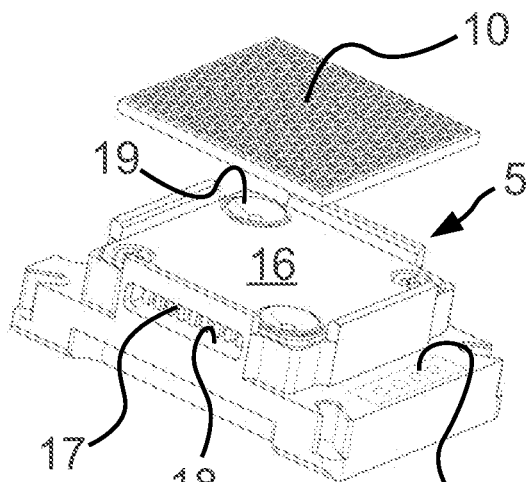
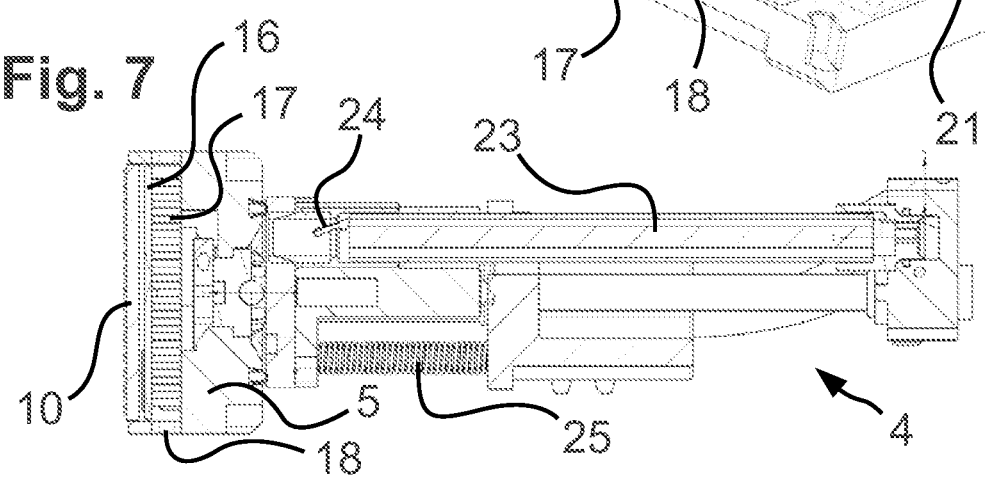

APPARATUS AND METHOD FOR TESTING ELECTRONIC DEVICES

This application claims priority to and the benefit of European Patent Application No. 13 155 976.7, filed on Feb. 20, 2013, the entire content of which is incorporated herein by reference.

The invention relates to an apparatus and a method for testing electronic devices.

After manufacture electronic devices are usually subjected to certain tests to check their electric and/or sensory functions. For this purpose usually a variety of electronic devices will be attached to a carrier. This carrier is then transferred to a so-called handler and will be positioned there accurately.

A test head is attached to the handler. In one embodiment the entire carrier will be moved in that way that all attached electronic devices can be contacted and tested at the same time. But there are also known embodiments, in which electronic devices individually or in groups are removed from the carrier by a positioning device and be brought in contact with one or more test sockets coupled to the test head. The positioning device, often designed as a plunger, comprises a so-called lead-backer being attached to the plunger. Its inner shape is adapted to the outer contour of the electronic device and it supports the electronic device during the test. In another embodiment the electronic devices will be fed and handled separately without a carrier.

Since the electronic devices should be tested only in a specified temperature range, in the positioning device normally air conducting channels are provided and conditioned air is supplied to the electronic devices. In order to perform the test in a temperature range being above the temperature of the ambient air, the electronic devices are subjected to heated air. The predetermined temperature range, in which the test is carried out, is referred to as set temperature.

Certain electronic devices produce an enormous thermal dissipation during the test, which heats the electronic devices. To meet the specified temperature range during the test, such electronic devices have to be cooled considerably during the test.

For this purpose, cooling devices are known, often requiring a completely amended handler concept. Using these known cooling devices the lead-backer has to be connected to flexible pipes which must be moved continuously together with the positioning device. These flexible pipes must have a relatively large cross section, so that an amount of cooling medium may flow, which can guarantee a sufficient cooling of the electronic device.

Because of the size of such units usually only means for testing a single electronic device or at most two electronic devices simultaneously can be realized. As the flexible pipes have to be entrained movement of the positioning device can not be performed very quickly. This implies low capacity of the equipment which can only be compensated by the parallel operation of a greater number of devices meaning high investment and high operating costs.

The invention is based on the object to provide an apparatus and a method for testing electronic devices being designed so that an effective heat removal is possible without limiting the smooth motion of the positioning device. Likewise, the number of simultaneously testable electronic devices should not be reduced or only slightly be reduced.

The invention is based on the conclusion that a cooling medium must be supplied only during the test, but not during transport of the electronic device in its testing position. Since the electronic device has to be supported and to be pressed against the test socket by the lead-backer during the test, cooling has to be performed by means of the lead-backer. According to the invention therefore a supply connection port for supplying a temperature control medium to a temperature control system of the lead-backer is immovably mounted beside the test socket. The temperature control system of the lead-backer and the supply connection port communicate with each other when the electronic device is in testing position, whereby the temperature control medium flows from the supply connection port to the temperature control system of the lead-backer.

A positioning device typically comprises a length adjustable plunger, which is usually also rotatable about an axis or linearly movable so that the electronic devices could be taken up and could be pressed against a test socket at another location. At its free end the plunger is provided with at least one suction cup provided for receiving and holding an electronic device by means of a vacuum.

The lead-backer is attached to the free end of the plunger and its task is to support the electronic device when it is pressed against the test socket. To avoid damaging of the electronic device the shape of the lead-backer is exactly adapted to the shape of the electronic device. An opening can be provided in the lead-backer to surround the at least one suction cup mounted at the plunger for receiving and holding the electronic device. The at least one suction cup may also be part of the lead-backer and may be connected to the plunger by means of a vacuum pipe.

According to the invention nothing of the plunger needs to be changed. Therefore also the handler concept has not to be changed. For testing electronic devices with great dissipation an accessory kit with a changed lead-backer is sufficient. Changes of the so called contact unit holder of the handler are also necessary, but this should not be problematic, because the contact unit holder is fixed and has not to be moved.

The heat generated by the electronic device during testing has to be dissipated very uniformly. A punctual or striped heat dissipation would not be useful since civil tensions would be generated in the electronic device which could damage or even destruct it. Therefore the supply connection port comprising advantageously a distribution chamber, distributing the temperature control medium in the way that it flows uniformly through the temperature control system of the lead-backer, whereby the temperature control medium entering the distribution chamber from a channel.

Before testing, the electronic device usually must be heated to the defined set point, the so-called set temperature. For this purpose, heating air will be delivered from the above mentioned channels of the plunger to the temperature control system of the lead-backer.

At least for larger electronic devices it is useful to feed the devices within a carrier into a temperature control chamber for heating up the electronic devices to set temperature before they will be received by the positioning device.

Once the electronic device is in its testing position, heating air passes from the distribution chamber of the supply connection port through the temperature control system of the lead-backer. This heating air is a multiple amount of the volume of heating air coming from the plunger. The temperature control medium should neither cool down the electronic device nor heat it up further. Therefore the temperature control medium should also be adjusted to set temperature. For this purpose the supply connection port comprising a first temperature sensor. Using the signals of this first temperature sensor the temperature control medium can be heated up or cooled down or its composition may be changed in that way that the temperature control medium flowing into the distribution chamber is also on set temperature.

Once testing of the electronic device starts, the power dissipation heats the electronic device. For testing electronic devices with high thermal dissipation, it is not sufficient to use temperature control medium on set temperature for keeping the electronic device on set temperature throughout the whole test. Therefore the temperature of the temperature control medium has to be lowered in that way, that the electronic device can be kept on set temperature or can be controlled to set temperature as soon as possible.

For example, this could be achieved by a pre-measurement. During this pre-measurement a certain type of electronic device could be tested and the amount or the temperature of the temperature control medium could be controlled time-resolved so that the temperature of the electronic device may not increase during testing. This time-resolved control of the temperature of the temperature control medium may be optimized in several test serials. This would lead to an exact time-resolved control curve which indeed is valid only for one type of electronic device, but it will surely prevent the temperature of the electronic device to increasing above the set temperature during the test.

In a preferred embodiment of the invention the lead-backer comprising a second temperature sensor. The second temperature sensor indirectly detects the temperature of the electronic device through the temperature of the heat-sink of the temperature control system of the lead-backer and allows the continuous control of the temperature of the electronic device during testing. In this way the temperature of the temperature control medium can be adjusted immediately. For this case an indirect control of the temperature of the temperature control medium and the recording of a separate control curve for each type of electronic device is not necessary.

Since the measurement of the temperature of the electronic device is made by a temperature sensor provided at the lead-backer and moved together with the positioning device, an electrical connection between the second temperature sensor and the fixed mounted unit for regulating the temperature of the temperature control medium is difficult. Therefore at the lead-backer as well as beside the test socket contacts are provided, for transmitting temperature signals from the second temperature sensor to a fixed mounted part of the apparatus when the electronic device is in testing position. These contacts can transmit signals and power supply only throughout testing when the electronic device is in testing position and the contacts are closed. But the movement of the positioning device is not impeded by a cable or something else. At one contacting side the contacts are designed as so-called pogo pins, each having a spring-loaded contact stick for establishing a secure connection.

The use of a liquid temperature control medium always means sealing problems. Especially if there is no fixed circuit and a dosed circuit is only achieved by pressing the electronic device in its testing position, leakage problems will arise. Therefore air, in particular purified air, is used as temperature control medium. If a leakage exists for example between the support connection port and the lead-backer, the purified air produces a slight positive pressure within the housing of the handler and exits via gaps and grooves of the housing into the ambient air. According to this feature the penetration of dust into the housing can be prevented.

According to the inventive method a feed opening of the lead-backer is positioned next to a fixed mounted supply connection port beside the test socket, whereby a temperature control medium is supplied from the supply connection port to the feed opening of the lead-backer, when the electronic device is in testing position. In this way the connection of the lead-backer to the temperature control medium will be concluded only when the electronic device is pressed in its testing position. If the lead-backer is not in testing position no pipes are connected to the lead-backer which could hinder movement of the positioning device. Nevertheless sufficient cooling of the electronic device is guaranteed during testing.

It could be provided a circuit for a temperature control medium accordingly opened and activated if an electronic device is pressed in testing position. But advantageously the temperature control medium flows constantly, even if there is no electronic device in testing position. If purified air is used as temperature control medium the support connection port can stay open, when there is no electronic device in testing position. To realize a predetermined temperature of the temperature control medium even in this state the temperature of the temperature control medium is controlled by a first temperature sensor provided in the supply connection port, when the electronic device supported by the lead-backer is not in testing position.

For testing electronic devices, specific predetermined test temperatures the so-called set temperatures are dictated. As usual the electronic device will be heated to or kept on set temperature by heated air in the positioning device. In order to hold the set temperature of the electronic device also in testing position, the temperature of the temperature control medium is adjusted to a predetermined set temperature by the first temperature sensor within the support connection port when the electronic device is not in testing position.

Advantageously the temperature of the temperature control medium is controlled by a second temperature sensor, attached to the lead-backer, when the electronic device, supported by the lead-hacker, is in testing position. The change in temperature control can either be initiated by pressing the electronic device in its testing position or by starting the test. Changing of temperature control has the advantage that a drift of the temperature of the electronic device can be compensated directly by changing the volume or the temperature of the temperature control medium.

In another embodiment of the invention the temperature of the temperature control medium is controlled by a temperature sensor of the electronic device itself when the electronic device, supported by the lead-backer, is in testing position. In this embodiment no second temperature sensor is needed at the lead-backer and technical arrangements for contacting the second temperature sensor to a fixed mounted part of the apparatus will be omitted. Otherwise it can not be excluded that the temperature sensor, integrated in the electronic device, will be defective. In this case the set temperature would not be kept and the result of the test would be irrelevant.

Advantageously the volume or the volume and the temperature of the temperature control medium is adjusted in that way that the temperature of the electronic device will adapt to the predetermined set temperature. At the beginning of the test the temperature of the electronic device normally will increase. If the electronic device should be brought down to set temperature as quickly as possible, in the beginning it should be cooled very heavily, for example by air with a temperature of minus 70° C. This can mean that the electronic device will be cooled under set temperature before the control can be react accordingly. Depending on the inertia of the system it may be able to settle on set temperature in a relatively short time. The inertia of the system could also be adjusted in the way that after the first increase of the temperature no further overshoot will happen, but the electronic device will be cooled evenly to set temperature after the first temperature increase.

Further details and advantages of the invention will become apparent from the description of an embodiment, which is described in detail with reference to the accompanying drawings, in which:

FIG. 1 a view of a handler with test head and tester

Figure 2:
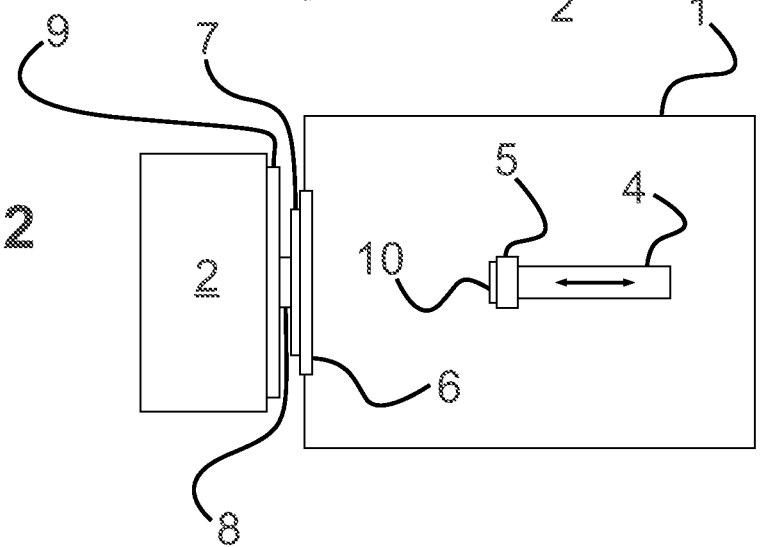
Figure 3:
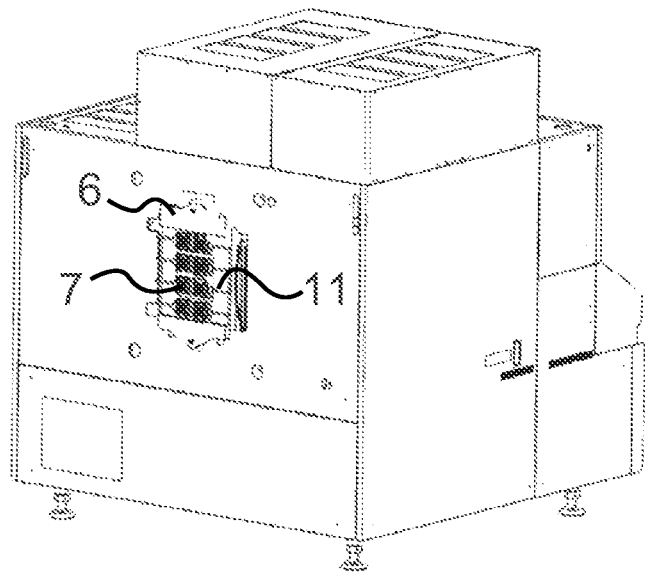

FIG. 2 a schematic representation of handler and test head,

FIG. 3 a view of an inventive apparatus with the test head demounted,

FIG. 4 a cross sectional view of a part of the apparatus with an electronic device in test, FIG. 5 a plan view of the portion of the apparatus of FIG. 4 without an electronic device, FIG. 6 an exploded view of the lead-backer with an electronic device and FIG. 7 a cross sectional view of the plunger with the lead-backer and an electronic device.

In FIG. 1 an exterior view of a handler 1 and the associated tester 3 is shown. The connection between the handler 1 and the tester 3 is affected via the test head 2.

FIG. 2 shows the coupling between handler 1 and test head 2. In the handler 1 a positioning device comprising a plunger 4 is schematically shown. The plunger 4 is movable in the direction of the double arrow. At one end of the plunger 4 the lead-backer 5 is attached holding the electronic device 10.

The contact unit holder 6, the centering plates 7, the test sockets 8 and the load board 9 are attached to the handler 1. Since these components usually are attributable to the handler 1 the connection between the handler 1 and the tester 3 is normally due to the coupling between the test head 2 and the load board 9.

In FIG. 3 the test head 2 and the load board 9 are removed and a contact unit holder 6 together with eight centering plates 7 are now visible at the back of the handler 1. Nevertheless this is only an example and there can also be provided more or less centering plates in a contact unit holder. In a more detailed backside view one could distinguish between the centering plates and the appropriate test sockets. In the interior of the handler 1 a corresponding number of plungers 4 is provided so that eight electronic devices 10 can be tested simultaneously.

FIG. 4 shows a cross sectional view of a contact unit holder 6 together with a centering plate 7. The lead-backer 5 along with the electronic device 10 is pressed against the test socket 8 by the plunger 4, not shown in this drawing, and is located in testing position. The contact unit holder 6 is provided with an channel 11, supplying air to the air distribution chamber 13 in the centering plate 7. That air is used as temperature control medium. The air channel 11, the air distribution chamber 13, the inlet 14 and the outlet 15 form the supply connection port.

The inlet 14 and the outlet 15 of the air distribution chamber 13 are arranged on different levels. In this way the air in the air distribution chamber 13 is well distributed and flows very evenly through the temperature control system of the lead-backer 5 which is mainly formed by the heat-sink 16 with its cooling fins 17.

The detailed structure of the lead-backer 5 is shown in FIG. 6. The electronic device 10 is coupled to the lead-backer 5 by means of the suction cups 19. The electronic device 10 is contacting extensively to one side of the heat-sink 16. At the opposite side of the heat-sink 16 a large number of cooling fins 17 are provided, transmitting heat between the heat-sink 16 and the air between the cooling fins 17.

The air passes into the lead-backer 5 to one of the air transfer openings 18 and exits through the other air transfer opening at the opposite side. The supply opening of the lead-backer 5 is formed by one of the air transfer openings 18.

FIG. 5 shows a centering plate 7 with a test socket 8 and its not explicitly referenced test contacts as well as the air channel 11 in a top view. The lead-backer 5 together with the electronic device 10 is not in testing position and therefore not visible in this view.

In the air channel 11 a first temperature sensor 12 (see FIG. 4) is provided close to the inlet 14 of the air distribution chamber 13. By this first temperature sensor 12 the temperature of air, supplied through the air channel 11, can be determined. If the air has to be heated, in the air channel 11 a heating coil, not shown in this view, could be provided.

A second temperature sensor 20 is provided at the heat-sink 16 between its cooling fins 17. The temperature of the electronic device can be determined indirectly via the heat-sink 16 by this second temperature sensor 20. For supplying the second temperature sensor 20 with power and for transmitting temperature signals between the movable lead-backer 5 and the fixed mounted contact unit holder 6 the lead-backer 5 is provided with a first contact panel 21 and the centering plate 7 is provided with a second contact panel 22.

While one of both contact panels has simple contact surfaces the opposing contact panel is provided with spring-loaded contact sticks, so-called pogo pins. An electrical connection between both contact panels will only exist if the lead-backer 5 together with the electronic device (10) is in testing position, as shown in FIG. 4. The contacts of the first contact panel 21 at the lead-backer 5 are connected to the second temperature sensor 20 at the heat-sink 16. The contacts of the fixed mounted second contact panel 22 at the centering plate 7 are connected to regulation means, not shown in this view.

In FIG. 7 a cross sectional view of a plunger 4 together with a lead-backer 5 and an electronic device 10 is shown. In the plunger 4 a heating air channel 23 is provided with a third temperature sensor 24. The air flowing through this heating air channel 23 is supplied via not visible channels of the lead-backer 5 into the space formed by the heat-sink 16 and its cooling fins 17. In this way heat can be transmitted between the air and the cooling fins 17.

Within the plunger 4 also not visible vacuum pipes are provided which are coupled to the suction cups 19 of the lead-backer 5. For bringing the lead-backer 5 together with the electronic device 10 in testing position the plunger 4 can be extended pneumatically. The lead-backer 5 can be withdrawn from testing position by means of the plunger spring 25.

Hereinafter, the function of the inventive apparatus and method should be described with references to the drawing.

Inside the handler 1 eight plungers 4 are provided which can be operated simultaneously. In FIG. 3 a contact unit holder 6 with eight centering plates 7 and the corresponding number of air channels 11 is visible. To each of these eight centering plates 7 a separate test socket 8 is mounted, so that eight electronic devices 10 can be tested simultaneously.

The electronic devices 10 can be supplied to the handler 1 in a carrier. For many applications inside the handler a heating chamber is provided in which the electronic devices can be heated up to the set temperature.

If the electronic devices 10 are held in the carrier with its contacts faced down, the plungers 4 can take up the electronic devices 10 directly and press it against the test sockets 8. In the other case, if the electronic devices 10 are held in the carrier with its contacts face up, additional pick-and-place-devices must be used for taking the electronic devices 10 from the carrier and passing them over to the plungers 4, so that their contacts can be pressed against the test sockets 8.

Heated air will be supplied through the heating air channel 23 to the cooling fins 17 of the lead-backer 5, attached to the plunger 4. This heating air flow is controlled by the third temperature sensor 24 and is adjusted to set temperature. That set temperature normally is at 85° C. but also other set temperatures are used. The heated air will heat rap the electronic device 10 to set temperature via the cooling fins 17 and the heat-sink 16.

Heated air will also be supported to each centering plate 7 through the air channels 11. Here the air will be controlled by the first temperature sensor 12 and will also be adjusted to set temperature. The heated air enters the air distribution chamber 13 via the inlet 14 and exits it as a uniform flow via the outlet 15. Since there is no electronic device 10 in testing position the heated air blows over the test socket 8 and heats its contacts up to the set temperature.

Now the plunger 4 moves the attached lead-backer 5 into a receiver opening of the centering plate 7 for pressing the electronic device 10, supported by the lead-backer 5, against the test socket 8 into its testing position. In testing position an air transfer opening 18 of the lead-backer 5 is positioned in line with the outlet 15 of the air distribution chamber 13 of the centering plate 7. Air being on set temperature now flows from the air channel 11 via the air distribution chamber 13 into the temperature control system 16, 17 of the lead-backer 5, so that no change of temperature neither of the temperature control system 16, 17 nor of the electronic device 10 will happen. The air exits the temperature control system 16, 17 of the lead-backer 5 via the air transfer opening 18 at the opposite side of the lead-backer 5 and enters into the housing of the handler 1. The resulting slight overpressure in the housing exits the housing via apertures and slots, thus preventing dust entry into the housing.

Once the electronic device 10 is in testing position and its contacts will be pressed against the test socket 8 the control of air temperature by the first temperature sensor 12 will be switched off. Instead the air temperature will be controlled by the second temperature sensor 20, being attached directly to the heat-sink 16 of the lead-backer 5.

During testing of electronic devices 10 thermal dissipation occurs. As the predetermined set temperature is required for testing, the heat, generated during testing has to be discharged. For testing electronic devices of higher electric power, the discharging rate is not big enough, if they will be cooled by air on set temperature.

Accordingly the temperature of the air, supplied via the air channel 11, has to be adjusted below the set temperature as soon as the electronic device 10 is heated up to a temperature above the set temperature. This adjustment will be effected by the second temperature sensor 20 since it is directly attached to the heat-sink 16 and an increase of temperature of the electronic device 10 can be detected very fast.

It is also possible to map a separate temperature curve for each type of electronic device, which presents the necessary changing of air temperature with respect to the timely progress of testing. In this case the second temperature sensor 20 will be used mainly for mapping the curve. Also during testing of the electronic devices 10 the second temperature sensor 20 can perform an important control task and can correct the air temperature quickly if the electronic device 10 will differ from the set temperature. Another way for maintaining the set temperature during testing is possible, if a separate temperature sensor is provided inside the electronic device 10. In this case the adjustment of the air temperature can be done by the tester 3 by means of the measured data.

During testing of electronic devices of high thermal dissipation it can happen that air at ambient temperature is insufficient to keep the electronic device 10 on set temperature during testing. In this case a chiller may be used, supplying cooled air at minus 70° C. The adjustment of the air temperature can be done for example via mixing of ambient air with air from the chiller.

The air will be supplied via the air channels 11 at a pressure of 5 bar. Air distribution chamber 13, inlet 14 and outlet 15 are dimensioned in that way, that a pressure of 5 bar will result in a volume flow of 30 to 40 liter per minute through the temperature control system 16, 17 of the lead-backer 5. The air flow via the heating air channel 23 of the plunger 4 is however a fraction of this volume. Therefore it must not be switched off during testing. As soon as the air flow from air channel 11 effects the temperature control system 16, 17 of the lead-backer 5 the air flow of the heating air channel 23 is without any effect.

When testing is finished the plunger 4 with the attached lead-backer 5 withdraws the electronic device 10 from the test socket 8. The electronic device 10 will be put into a carrier, either directly by the plunger 4 or again via additional pick-and-place-devices. It could be the same carrier, from which the electronic devices have been removed, but also an additional carrier can be used for transporting the electronic devices 10 out of the handler 1.

Due to the invention, for cooling electronic devices with higher electronic power no flexible pipe connections are required, which are attached to the lead-backer and have to be moved along with the plunger. Only an unmovable mounted air supply has to be fixed at the centering plate 7. The electronic devices 10 will only be cooled during testing, when heat is generated and has to be discharged. If air is used as a temperature control medium, a miner leakage between the outlet 15 in the centering plate 7 and the air transfer opening 18 of the lead-backer 5 does not matter. Due to the invention, cooling air will be supplied to the temperature control system 16, 17 of the lead-backer 5 not before the lead-backer 5 will be moved into the receiver opening of the centering plate 7 and the electronic device 10 is in testing position.

An apparatus according to the invention can also be used as a cold test handler. In this case the set temperature is below the temperature of ambient air. Instead of precooling the electronic device in a special cooling chamber, it could be cooled down to set temperature when it is in testing position by using the above mentioned chiller. The test can be started as soon as the second temperature sensor 20 detects that the electronic device is on set temperature. Depending on the set temperature this process needs some time but it is much cheaper than providing a special cooling chamber.

What is claimed is:

1. Apparatus for testing electronic devices, said apparatus comprising:
    a test head coupled to at least one immovably mounted test socket;
    a positioning device for positioning the electronic device in a testing position; and
    a lead-backer attached to the positioning device for supporting the electronic device and pressing it against the test socket,
    wherein a supply connection port for supplying a temperature control medium to a temperature control system of the said lead-backer is immovably mounted beside the said test socket, the said temperature control system of the said lead-backer and the said supply connection port communicate with each other when the electronic device is in testing position, whereby the said temperature control medium flows from the said supply connection port to the said temperature control system of the said lead-backer;

wherein the said lead backer comprising a temperature sensor; and wherein at the said lead-backer as well as beside the said test socket contacts are provided, for transmitting temperature signals from the said temperature sensor to a fixed mounted part of the said apparatus when the electronic device is in testing position.

2. Apparatus according to claim 1, wherein the said supply connection port comprising a distribution chamber, the said distribution chamber distributing the said temperature control medium in the way that it flows uniformly through the said temperature control system of the said lead-backer, the said temperature control medium entering the said distribution chamber from a channel.

3. Apparatus according to claim 1, wherein the said supply connection port comprising a first temperature sensor.

4. Apparatus according to claim 1, wherein air is used as the said temperature control medium.

5. Method for testing electronic devices, wherein:

an electronic device is placed in a testing position at a test socket, coupled to a test head, by means of a positioning device and supported by a lead-backer attached to said positioning device; and a feed opening of the said lead-backer is positioned next to a fixed mounted supply connection port beside the said test socket, whereby a temperature control medium is supplied from the said supply connection port to the said feed opening of the said lead-backer, when the electronic device is in testing position;

wherein the said lead backer comprising a temperature sensor; and wherein at the said lead-backer as well as beside the said test socket contacts are provided, for transmitting temperature signals from the said temperature sensor to a fixed mounted part of the said apparatus when the electronic device is in testing position.

6. Method according to claim 5, wherein the temperature of the said temperature control medium is controlled by the temperature sensor provided in the supply connection port, when the electronic device supported by the said lead-backer is not in said testing position.

7. Method according to claim 6, wherein the temperature of the said temperature control medium is adjusted to a predetermined set temperature by the temperature sensor.

8. Method according to claim 5, wherein the temperature of the said temperature control medium is controlled by the temperature sensor of the electronic device when the electronic device supported by the said lead-backer is in said testing position.

9. Method according to claim 5, wherein the volume or the volume and the temperature of the said temperature control medium is adjusted.

* * * * *